(12) United States Patent
Bao

(10) Patent No.: US 9,478,204 B2
(45) Date of Patent: Oct. 25, 2016

(54) SUB-HARMONIC MIXER

(75) Inventor: Mingquan Bao, Västra Frölunda (SE)

(73) Assignee: TELEFONAKTIEBOLAGET L M ERICSSON (PUBL), Stockholm (SE)

(*) Notice: Subject to any disclaimer, the term of this patent is extended or adjusted under 35 U.S.C. 154(b) by 119 days.

(21) Appl. No.: 14/425,921

(22) PCT Filed: Sep. 4, 2012

(86) PCT No.: PCT/EP2012/067173
§ 371 (c)(1),
(2), (4) Date: Mar. 4, 2015

(87) PCT Pub. No.: WO2014/037027
PCT Pub. Date: Mar. 13, 2014

(65) Prior Publication Data
US 2015/0194141 A1    Jul. 9, 2015

(51) Int. Cl.
*H04M 1/00*    (2006.01)
*G10H 1/32*    (2006.01)
*H03D 7/02*    (2006.01)
*H03D 7/12*    (2006.01)

(52) U.S. Cl.
CPC .................. *G10H 1/32* (2013.01); *H03D 7/02* (2013.01); *H03D 7/12* (2013.01)

(58) Field of Classification Search
CPC ........... H04M 1/04; H03D 7/02; H03D 7/12; H03D 7/1441; H03D 7/1433; H03D 7/165; H03D 7/1475; H03D 7/1458; H03F 1/0266; H03F 1/32; G10H 1/32
See application file for complete search history.

(56) References Cited

U.S. PATENT DOCUMENTS

| | | | |
|---|---|---|---|
| 6,351,632 B1 | 2/2002 | Yan et al. | |
| 6,901,249 B1* | 5/2005 | Kobayashi | H03D 7/125 455/190.1 |
| 2003/0130006 A1* | 7/2003 | Reynolds | H03D 7/145 455/550.1 |
| 2007/0222512 A1* | 9/2007 | Krishnamurthy | H03F 1/32 330/149 |
| 2008/0144709 A1 | 6/2008 | McCallister et al. | |
| 2015/0188741 A1* | 7/2015 | Chen | H04L 27/06 327/356 |

FOREIGN PATENT DOCUMENTS

CA    2 690 442 A1    7/2011
WO    WO-2011047703 A1    4/2011

OTHER PUBLICATIONS

International Search Report and Written Opinion for International Application No. PCT/EP2012/067173, mailed Dec. 10, 2012, 7 pages.

* cited by examiner

*Primary Examiner* — Thanh Le
(74) *Attorney, Agent, or Firm* — Nicholson De Vos Webster & Elliot LLP

(57) ABSTRACT

A sub-harmonic mixer comprising first and second input ports, and an output port, and arranged to output products of signals applied at the input ports. The sub-harmonic mixer comprises a first stage a second stage arranged in series with each other, with the input ports of the sub-harmonic mixer being input ports of the first stage, and the output port of the sub-harmonic mixer being an output port of the second stage. An output port of the first stage is connected to an input port of the second stage. The first stage is arranged to generate a fundamental product and a first third order intermodulation distortion product in-phase with each other. The second stage is arranged to generate a second third order intermodulation distortion product in anti-phase to the fundamental product generated by the second stage.

9 Claims, 9 Drawing Sheets

SUB-HARMONIC MIXER

CROSS-REFERENCE TO RELATED APPLICATIONS

This application is a National stage of International Application No. PCT/EP2012/067173, filed Sep. 4, 2012, which is hereby incorporated by reference.

TECHNICAL FIELD

The present invention discloses an improved sub-harmonic mixer.

BACKGROUND

Mixers are important building blocks in radio technology, and are designed to multiply two or more input AC signals with each other, and to output one or more AC products of the input signals, relying on the "addition and subtraction" which arises when two AC signals are multiplied by each other.

Due to the "addition and subtraction" mentioned above, mixers can be used both to "up-convert" and to "down-convert" signals, i.e. a signal at a certain frequency can by means of multiplication by another signal in a mixer be transposed to a higher or a lower frequency.

In a radio application, for example, a mixer can be used to down-convert a high frequency RF signal, $f_{RF}$, into a low frequency IF signal, $f_{IF}$, or vice versa, by means of multiplication with a signal from a Local Oscillator, an LO. In down-conversion, the IF frequency $f_{IF}$ is equal to the difference of the RF frequency, $f_{RF}$, and the LO frequency, $f_{LO}$, so that $f_{IF}=f_{RF}-f_{LO}$.

A special group of mixers are so called sub-harmonic mixers, which utilize harmonics of the LO signal, i.e. $N*f_{LO}$, where N is an integer.

With increasing RF frequencies, for instance in applications on the E-band, sub-harmonic mixers may be more attractive, since they require an LO frequency which is half of that of a conventional mixer, i.e. $2*f_{LO}$ if N=2. In such a case, in the case of down-conversion, $f_{IF}=f_{RF}-2*f_{LO}$, since the obtained IF frequency is a mixing product of the RF signal and the second harmonic of the LO signal. Another advantage of sub-harmonic mixers is that an LO source which operates at a low frequency has a low phase noise.

However, sub-harmonic mixers usually exhibit low conversion gain, high LO power consumption, and poor linearity.

Another factor which is often looked at in sub-harmonic mixers is their linearity, which is often measured by the so called IMD3, i.e. third order intermodulation products in two-tone measurements. A lower IMD3 indicates a better linearity.

SUMMARY

It is an object of the invention to obtain a sub-harmonic mixer which obviates at least some of the disadvantages mentioned above.

This object is achieved by means of a sub-harmonic mixer which comprises a first and a second input port, and an output port.

The sub-harmonic mixer is arranged to output at the output port products of signals applied at the first and second input ports.

The sub-harmonic mixer comprises a first stage comprising a mixer and a second stage comprising an amplifier. The stages are arranged in series with each other, so that an output port of the first stage is connected to an input port of the second stage. The first and second input ports of the sub-harmonic mixer are input ports of the first stage, and the output port of the sub-harmonic mixer being an output port of the second stage.

In the sub-harmonic mixer, the first stage is arranged to generate a fundamental product and a third order intermodulation distortion product which are in-phase with each other, and the second stage is arranged to generate a third order intermodulation distortion product which is in anti-phase to the fundamental product generated by the second stage.

In embodiments of the sub-harmonic mixer, the mixer comprises a power combiner with two input ports which are arranged to be used as the two input ports of the mixer and with an output port which is connected to the base of a bipolar junction transistor as well as to the cathode of a diode. The anode of the diode and the emitter of the transistor are grounded, and the collector of the transistor is arranged to be used as the output port of the mixer.

In embodiments of the sub-harmonic mixer, the amplifier comprises a bipolar junction transistor with its base arranged to be used as the input port and its collector being arranged to be used as the output port of the amplifier and of the entire sub-harmonic mixer, with the emitter being arranged to be connected to a DC bias voltage.

There is also disclosed a sub-harmonic mixer device which comprises a first and a second sub-harmonic mixer of any of the embodiments described above, and which also comprises a balun. The balanced ports of the balun are connected to the second input ports of each sub-harmonic mixer, and the unbalanced port of the balun is arranged to be used as an input port of the sub-harmonic mixer device. The sub-harmonic mixer device additionally comprises a differential amplifier with a first and a second input port to which the output ports of the first and second sub-harmonic mixers are connected, respectively. An output port of the amplifier is arranged to be the output port of the sub-harmonic mixer device.

In embodiments of the sub-harmonic mixer and of the sub-harmonic mixer, the bipolar junction transistors are replaced by Field Effect Transistors, with the ports of the bipolar junction transistors being substituted by ports of the Field Effect Transistors as follows:

| Bipolar junction transistor, port | FET, port |
| --- | --- |
| Collector | Drain |
| Emitter | Source |
| Base | Gate |

BRIEF DESCRIPTION OF THE DRAWINGS

The invention will be described in more detail in the following, with reference to the appended drawings, in which.

DETAILED DESCRIPTION

Figure 1:
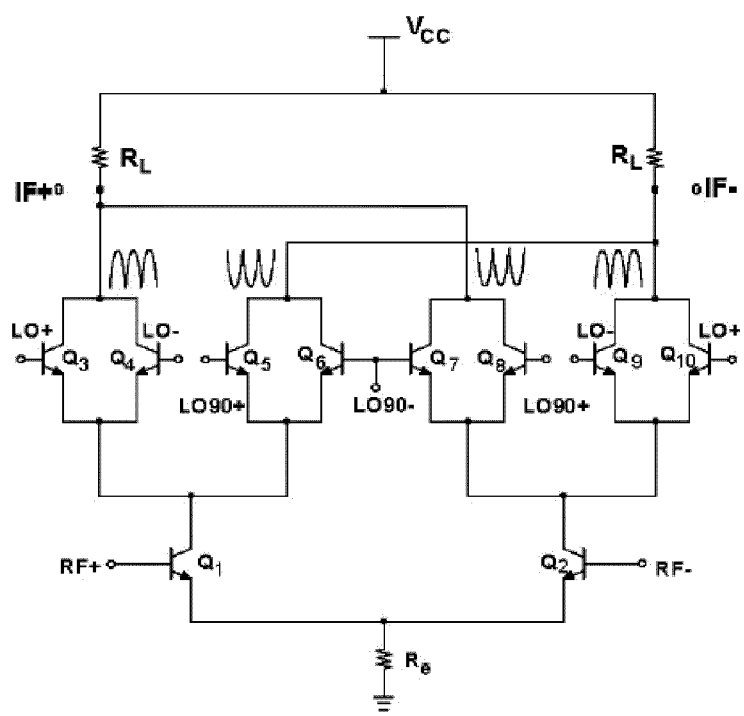
FIG. 1 shows a prior art subharmonic mixer.

Embodiments of the present invention will be described more fully hereinafter with reference to the accompanying drawings, in which embodiments of the invention are shown. The invention may, however, be embodied in many different forms and should not be construed as being limited to the embodiments set forth herein. Like numbers in the drawings refer to like elements throughout.

The terminology used herein is for the purpose of describing particular embodiments only, and is not intended to limit the invention.

Before embodiments of the invention are described, a brief description will first be given of a prior art sub-harmonic mixer 100, shown in FIG. 1. The sub-harmonic mixer 100 is a so called Gilbert-type sub-harmonic mixer, which in this embodiment has an LO switching stage comprising eight transistors $Q_3$-$Q_{10}$, and a transconductance-stage comprising an emitter-coupled transistor pair $Q_1$ and $Q_2$ with the function of transferring a voltage (+/−RF) injected at the bases of the transistors into a collector current signal. The transistors of the LO switching stage can be connected either in parallel, as shown in FIG. 1, or they can be "stacked".

A problem with prior art sub-harmonic mixers, including the type shown in FIG. 1, i.e. Gilbert type sub-harmonic mixers, is, as mentioned previously, that they usually exhibit low conversion gain, high LO power consumption, and poor linearity, as exhibited by a large IMD3, i.e. the third order intermodulation products, in two-tone measurements.

Figure 2:
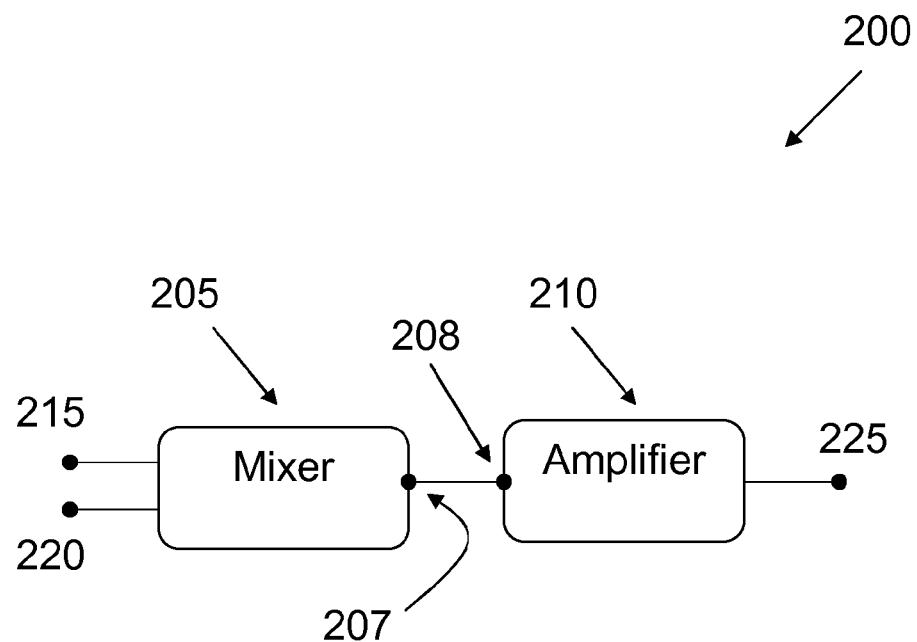
FIG. 2 shows a schematic block diagram of a sub-harmonic mixer.

FIG. 2 shows a basic block diagram of an embodiment 200 of a sub-harmonic mixer: the sub-harmonic mixer 200 comprises a mixer 205 and an amplifier 210, arranged in series with each other, with the mixer being "first" in the serial connection, as seen from the input ports 215, 220, of the sub-harmonic mixer 200. Thus, the sub-harmonic mixer 200 comprises a first 215 and a second input port 220, as well as an output port 225.

As shown in FIG. 2, the serial connection between the mixer 205 and the amplifier 210 is achieved by virtue of the fact that the mixer 205 has an output port 207 which is connected to an input port 208 of the amplifier 210.

The mixer 205 can be seen as a first stage of the sub-harmonic mixer 200, and the amplifier 210 can be seen as a second stage of the sub-harmonic mixer 200.

The first 215 and second 220 input ports of the sub-harmonic mixer 200 are, in this embodiment, input ports of the first stage, i.e. of the mixer 205, and the output port 225 of the sub-harmonic mixer 200 is an output port of the second stage, i.e. of the amplifier 210.

The sub-harmonic mixer 200 is arranged to multiply signals which are applied at the input ports 215 and 220 with each other, and to output the products of such multiplications at the output port 225. Such products will comprise signals at frequencies which are the sum and the difference of the input signals, i.e. if a signal at frequency $f_1$ is applied at port 215 and a signal at frequency $f_2$ is applied at port 220, the resulting products will comprise signals at frequencies $f_1-f_2$ and $f_1+f_2$.

Furthermore, for a sub-harmonic mixer, the desired signal is either $f_1-N*f_2$ or $f_1+N*f_2$ where N is an integer, and $f_1$ and $f_2$ here correspond to the RF and LO frequencies, respectively. In order to measure the linearity of a mixer such as, for example, the sub-harmonic mixer of FIG. 2, a two-tone measurement is carried out: Two RF signals with the same amplitude but different frequencies, $f_{R1}$ and $f_{R2}$ are combined and injected into the mixer, by means of which third-order intermodulation products, IMD3, are generated at frequencies $2f_{R1}-f_{R2}-2f_{LO}$ and $2f_{R2}-f_{R1}-2f_{LO}$. The amplitude of the IMD3 can be used to characterize the nonlinearity of the sub-harmonic mixer. The sub-harmonic mixer 200 exhibits a low IMD3, and thus a high degree of linearity In the sub-harmonic mixer, the first stage 205 is arranged to generate a fundamental signal $f_0$ and a third order intermodulation distortion product which are in-phase with each other, and the second stage 210 is arranged to generate a third order intermodulation distortion product which is in anti-phase with the third order intermodulation distortion product generated by the first stage. The term "anti-phase" here refers to a phase difference of approximately 180 degrees, ideally exactly 180 degrees.

Since the third order intermodulation distortion product injected into the second stage from the first stage will thus be in anti-phase with the third order intermodulation distortion product generated by the second stage itself, those third order intermodulation distortion product will entirely or to a large extent cancel each other. In addition, since the second stage 210 comprises an amplifier, the second stage 210 also serves to increase the conversion gain of the entire sub-harmonic mixer 200.

Figure 3:
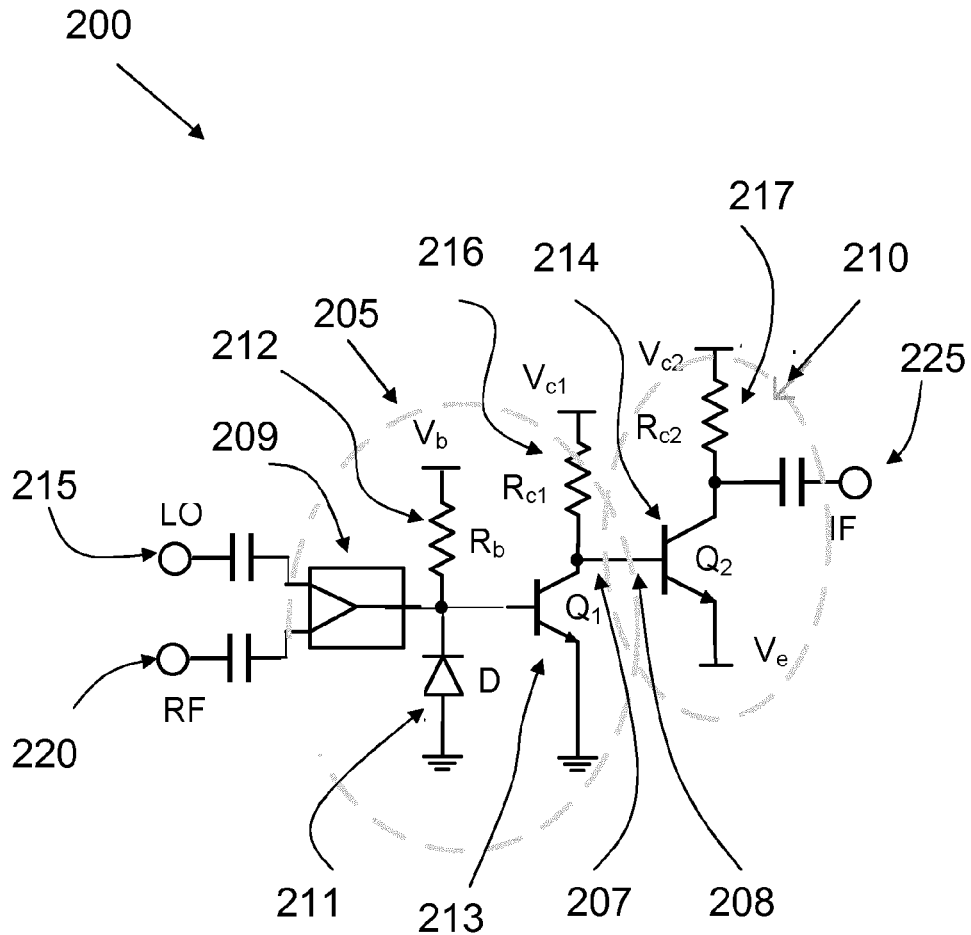
FIG. 3 shows a circuit diagram of an embodiment of the sub-harmonic mixer of FIG. 2, and FIGS. 4a and 4b show IF components and IMD3 products in the sub-harmonic mixer of FIGS. 2 and 3.

FIG. 3 shows a more detailed circuit diagram of an embodiment of the sub-harmonic mixer 200. As shown in FIG. 3, the mixer 205 comprises a power combiner 209 with two input ports which are arranged to be used as the two input ports 215, 220, of the mixer 205, suitably with capacitors arranged at each of the input ports.

The power combiner 209 also has an output port which is connected to the base of a bipolar junction transistor 213 as well as to the cathode of a diode 211. The anode of the diode 211 and the emitter of the transistor 213 are grounded, and the collector of the transistor 213 is arranged to be used as the output port of the mixer 205.

Furthermore, preferably the amplifier 210 comprises a bipolar junction transistor 214, with the base arranged to be used as the input port of the amplifier 210 and the collector arranged to be used as the output port of the amplifier 210 and also of the entire sub-harmonic mixer 200. Suitably, the emitter of the transistor 214 is arranged to be connected to a DC bias voltage $V_e$, in order to control the transistor's base-emitter bias voltage. The emitter of the transistor 214 is AC grounded.

As can be seen in FIG. 3, and as is gleaned from the description above, the connection between the mixer 205 and the amplifier 210 is achieved by means of the connection between the collector of the transistor 213 and the base of the transistor 214. The output of the mixer 205 and the amplifier 210 is thus DC-coupled, which enables the sub-harmonic mixer 205 to work at zero IF frequencies, which means that the sub-harmonic mixer 200 can be used in a homodyne receiver. The sub-harmonic mixer 200 can also be used in a heterodyne receiver, in which case a DC decoupling capacitor should be added between the two transistors 213, 214, and a bias voltage should be added at the base of the transistor 214 via a resistor, and the emitter of transistor 214 should be grounded.

As can be seen in FIG. 3, a bias voltage $V_b$ is arranged to be input at the base of the transistor 213 and the cathode of the diode 211 via a resistor $R_b$. In addition, one control voltage $V_{C1}$, $V_{C2}$ is arranged to be input at the collector of each of the transistors 213, 214, via respective resistors $R_{C1}$ and $R_{C2}$.

Figure 4A:
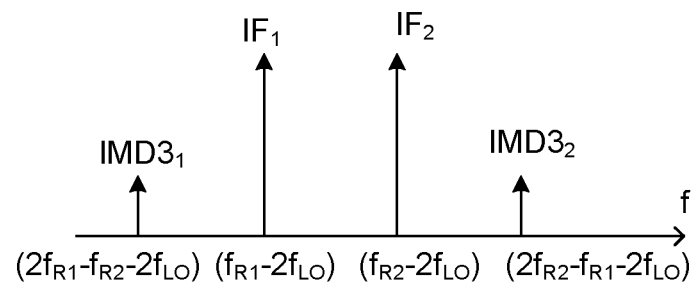
Figure 4B:
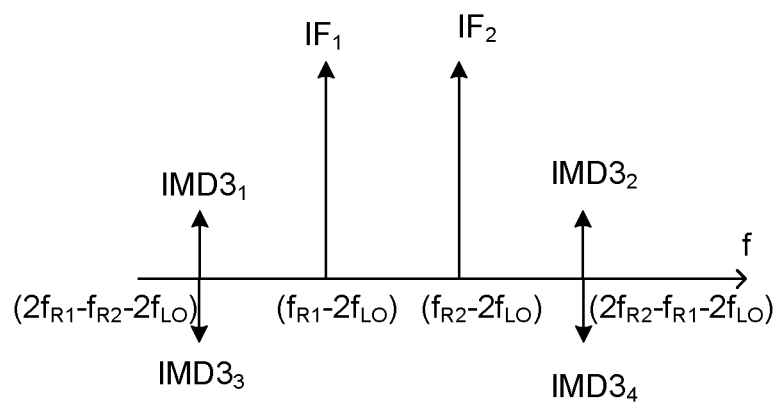

In order to illustrate the effects of the sub-harmonic mixer 200 on signals which are input to it and on the IMD3, reference will now be made to FIGS. 4a and 4b. If two RF signals at frequency $f_{R1}$ and $f_{R2}$ are combined, then, input to the one of the input ports 215, 220, and an LO signal is input to the other of the input ports 215, 220, two IF signals will be generated at the output port 207 of the mixer 205, said two signals being $(f_{R1}-2f_{LO})$ and $(f_{R2}-2f_{LO})$. However, due to imperfections in the mixer 205, there will also be generated two third-order intermodulation distortion products, $IMD3_1$ and $IMD3_2$. The two IF signals and the two IMD3 signals are shown in FIG. 4a. As can be seen, all four signals are in-phase with each other, which can also be expressed as:

$$0 \leq |\angle(IF_1) - \angle(IMD3_1)| = |\angle(IF_2) - \angle(IMD3_2)| \leq \pi/2$$

where the symbol $|\angle A|$ is used to signify the absolute of the phase of signal A.

The four signals shown in FIG. 4a are thus the signals which are injected into the amplifier 210, and which will be amplified by it. In addition to the injected signals, the amplifier by itself also generates IMD3 signals, here referred to as $IMD3_3$ and $IMD3_4$. If $IMD3_3$ and $IMD3_4$ can be made to be anti-phase to $IMD3_1$ and $IMD3_2$, respectively, then the IMD3 signals will cancel each other, as shown in FIG. 4b, leaving only the amplified IF signals, which will increase the linearity of the sub-harmonic mixer 200. The parameter IIP3 is often used to express the linearity of a mixer, and is defined as: $IIP3 = P_{RF,in} + (P_{IF} - P_{IMD3})/2$, where $P_{RF,in}$ is the input RF power, and $P_{IF}$ and $P_{IMD3}$ is the output power of the IF component and the IMD3 respectively.

Figure 5:
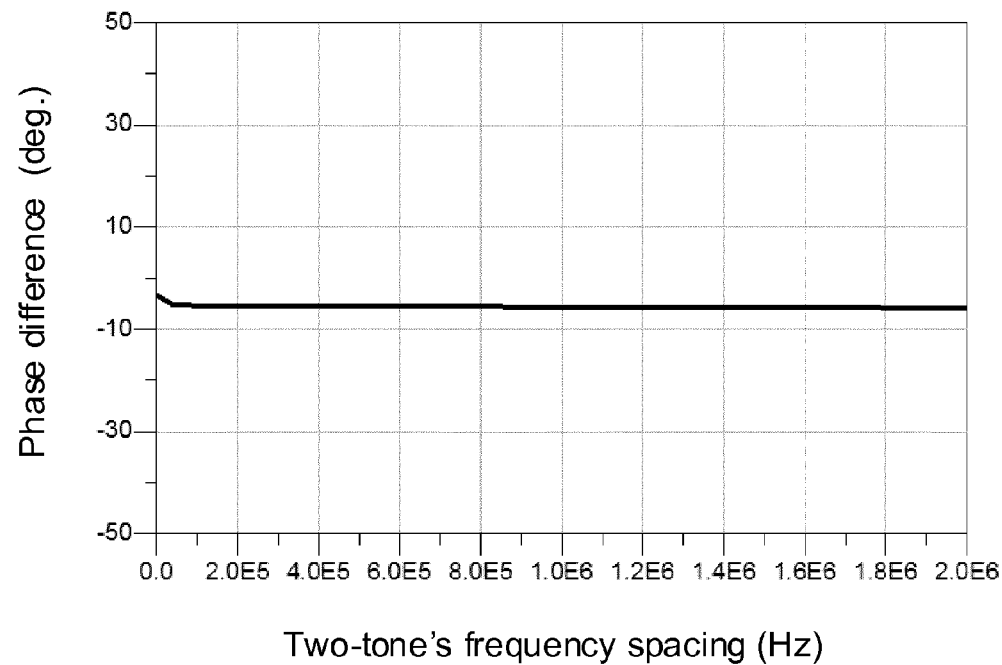
FIG. 5 shows the impact of a diode on the sub-harmonic mixer of FIG. 3.

Regarding how the mixer 205 of the sub-harmonic mixer 200 is made to generate IF-signals which are in-phase with the IMD3 signals it generates, the following can be said: a conventional mixer usually does not comprise the diode 211 of the mixer 205, and its IF-signals are anti-phase with the IMD3 signals. In order to illustrate the effect of the diode 211 on the output signals of the mixer 205, a two-tone RF signal with a power of –10 dBm at frequencies 151 GHz±5 kHz was combined and then applied at one of the input ports 215, 220, and an LO signal at 75 GHz and a power level of –1 dBm was applied at the other input port. The frequency difference of the two-tone RF signal is called frequency spacing. The phase difference between the IF components and the IMD3 products is approximately 27 degrees, i.e. within the limits of the definition of "in-phase", and FIG. 5 shows what happens the as frequency spacing is swept from 1 kHz to 2 MHz: as can be seen, the phase difference remains almost unchanged. In addition, the parameter IIP3 can be shown to be 8.47 dBm with the parameters given above for the input signals.

Furthermore, the diode 211 not only changes the phase difference between IF component and IMD3 product, but also influences the conversion gain and the conversion gain's so called 1-dB compression point, which is increased from –4.1 dBm to –0.2 dBm. In addition, the diode 211 gives the mixer 205 a conversion gain increase with input RF powers, in particular when the input RF power is larger than –16 dBm.

Figure 6:
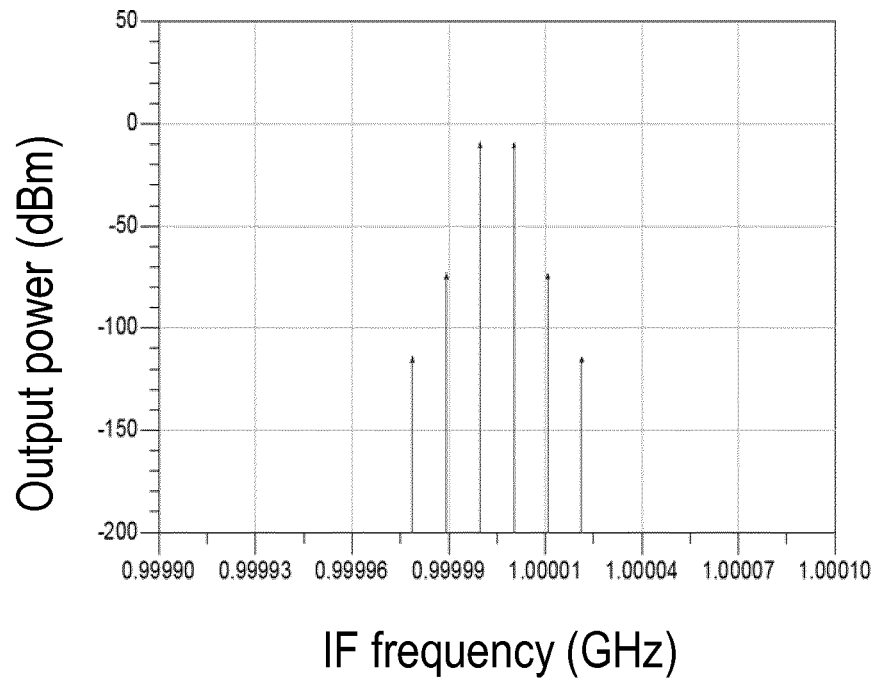
FIG. 6 shows the output of the amplifier of the sub-harmonic mixer of FIG. 3.
Figure 7:
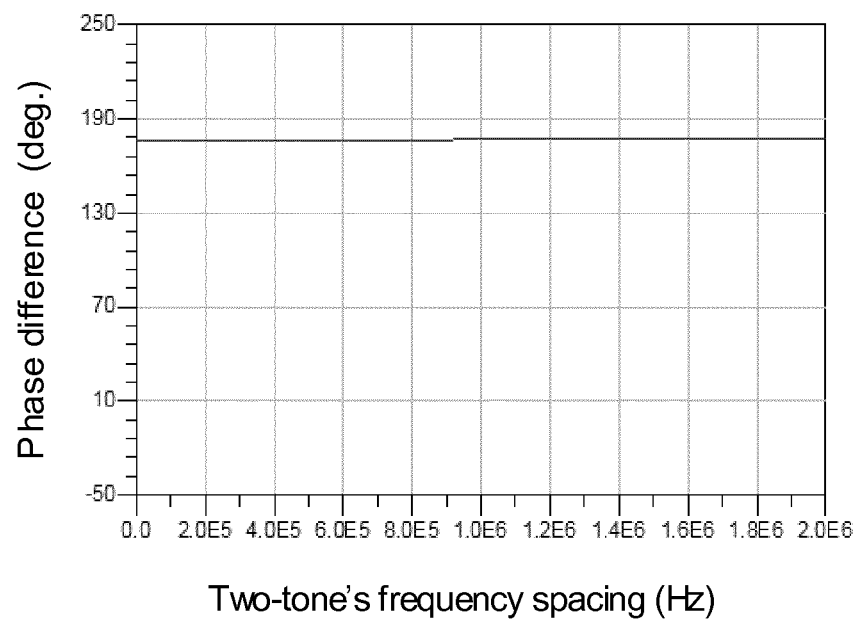
FIG. 7 shows a phase difference between a fundamental signal and the IMD3 in the amplifier of the sub-harmonic mixer of FIG. 3.

Turning now to the amplifier 210 of the sub-harmonic mixer 200, if two-tone IF signals with a power level of –22 dBm at a frequency of 1 GHz±5 kHz are input at the input port 208, the output will include amplified IF components and intermodulation products, as shown in FIG. 6. The IIP3 is 10.0 dBm. The phase difference between the amplified IF component and the IMD3 generated by the amplifier 210 itself is shown in FIG. 7, and is a constant 176 degrees, regardless of the two-tone frequency spacing, as shown in FIG. 7.

Figure 8:
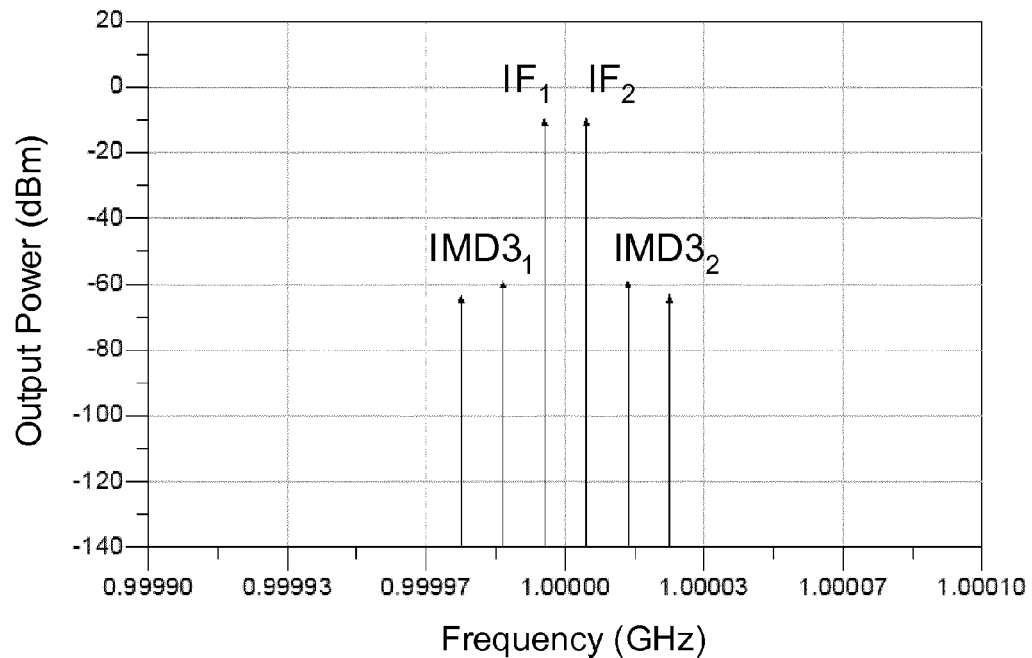
FIG. 8 shows the output of the entire sub-harmonic mixer of FIG. 3.

Turning now to some performance characteristics of the entire sub-harmonic mixer 200, FIG. 8 shows the output at port 225 when two-tone RF signals at frequency 151 GHz±5 KHz are applied at one of the input ports 215, and at the other of the input ports there is applied an LO signal at frequency 75 GHz; the power of the RF and the LO signals are –10 dBm and –1 dBm, respectively.

Thus, FIG. 8 shows the obtained spectrum around output IF frequencies $IF_1$ and $IF_2$. The IMD3 signals $IMD3_1$ and $IMD3_2$ are also shown, as well as some additional intermodulation products. The IIP3 is determined as 13.6 dBm and the conversion gain is 0.65 dB.

In some applications, such as, for example, homodyne receivers, a down-conversion mixer needs a good IIP2 which is a parameter which is associated with second-order intermodulation distortion products. If it is desired to use the sub-harmonic mixer 200 in a context where it is desired to reduce or eliminate second-order intermodulation products, a differential circuit topology can be employed in a sub-harmonic mixer device by means of using two of the sub-harmonic mixers as described above, as exemplified in an embodiment 600 which is shown in FIG. 9.

Figure 9:
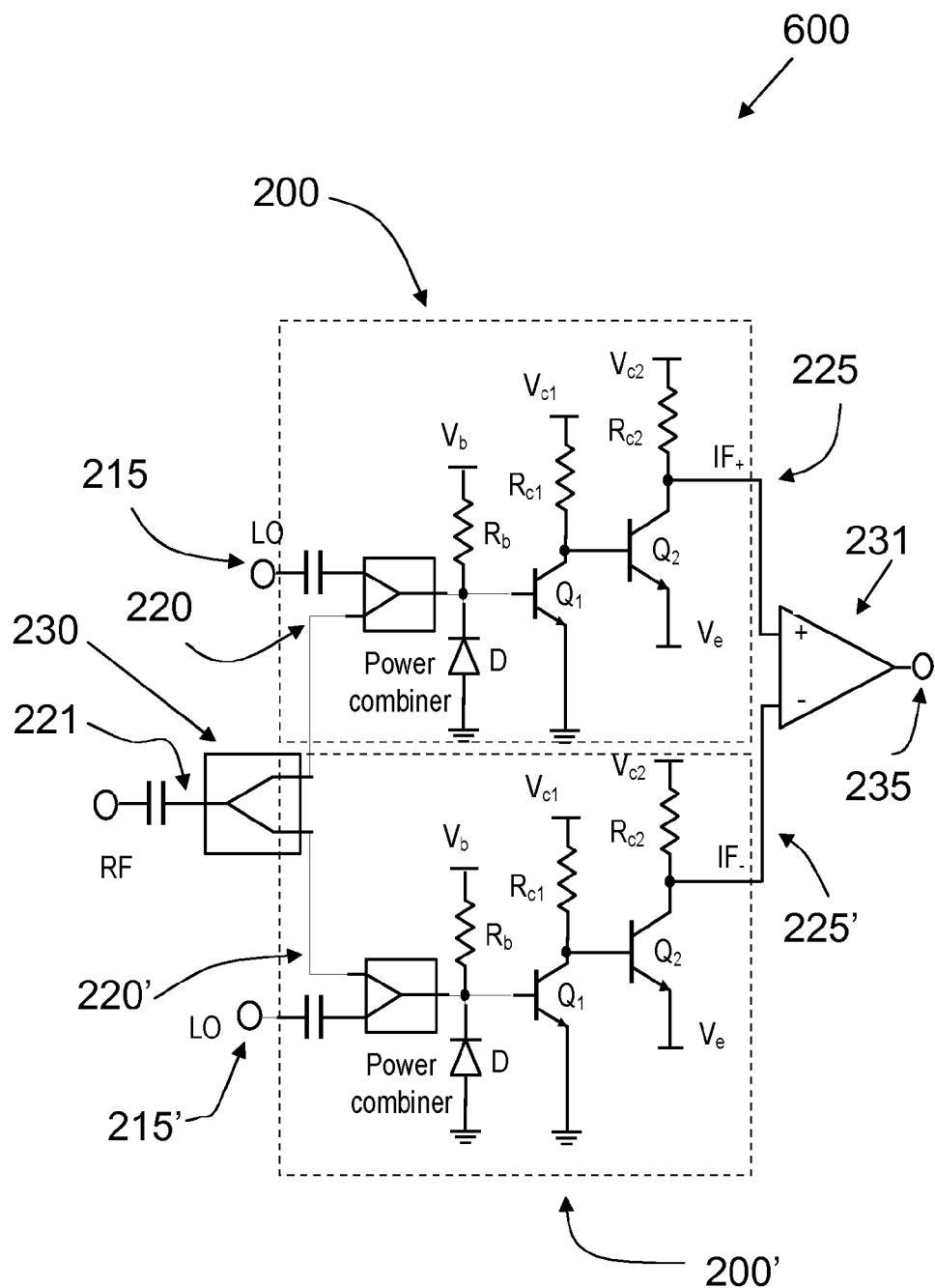
FIG. 9 shows an embodiment of a sub-harmonic mixer device.

The sub-harmonic mixer device 600 show in FIG. 9 comprises a first 200 and a second 200' sub-harmonic mixer, and also comprises a balun 230. A balun is by definition a component which has a balanced and an unbalanced side, with (usually) two ports on the balanced side and one port on the unbalanced side. In the embodiment 600, one balanced port of the balun is connected to the second input port 220 of one of the sub-harmonic mixers 200, and the other of the balanced ports of the balun is connected to the second input port 220' of the other of the sub-harmonic mixers 200'. In this manner, the unbalanced port 221 of the balun 230 is arranged to be used as input port of the sub-harmonic mixer device 600. In embodiments, a capacitor can be added before the unbalanced port 221.

As can be seen in FIG. 9, the sub-harmonic mixer device 600 additionally comprises a differential amplifier 231 with a first and a second input port. One of the input ports of the differential amplifier 231 is connected to the output port of one of the first and second sub-harmonic mixers 200, 200', and the other input port of the differential amplifier 231 is connected to the output port of the other of the first and second sub-harmonic mixers 200, 200'. The output port of the differential amplifier 231 is arranged to be the output port of the sub-harmonic mixer device.

Thus, input signals are connected to the balun's unbalanced port, and each of the balun's two balanced ports is connected to one of the sub-harmonic mixers 200, 200'. In this manner, the IF signals generated by the first and second sub-harmonic mixer 200, 200', will have the same amplitude but will be in anti-phase to each other, i.e. have a phase difference of 180 degrees, since they receive differential RF signals. However, the second-order intermodulation products from the sub-harmonic mixers 200, 200' will have the same amplitude and phase. Thus, the differential amplifier 231 is used to get the output IF signal: $IF = G \cdot (IF_+ - IF_-)$, where G is the gain of the differential amplifier 231. The second-order intermodulation distort products are reduced or entirely eliminated at the output of the differential amplifier 231.

The designs of FIGS. 2, 3 and 9 can also be applied in "fundamental" mixers, where a desired IF signal is obtained by mixing an RF signal with an LO signal's fundamental component.

In the drawings and specification, there have been disclosed exemplary embodiments of the invention. However, many variations and modifications can be made to these embodiments without substantially departing from the principles of the present invention. Accordingly, although specific terms are employed, they are used in a generic and descriptive sense only and not for purposes of limitation. For example, in the sub-harmonic mixer or the sub-harmonic mixer described above, the bipolar junction transistors can be replaced by Field Effect Transistors, with the ports of the bipolar junction transistors being substituted by ports of the Field Effect Transistors as follows:

| Bipolar junction transistor, port | FET, port |
|---|---|
| Collector | Drain |
| Emitter | Source |
| Base | Gate |

The invention is not limited to the examples of embodiments described above and shown in the drawings, but may be freely varied within the scope of the appended claims.

The invention claimed is:

1. A sub-harmonic mixer, the sub-harmonic mixer comprising:
    a first and a second input port;
    an output port, wherein the sub-harmonic mixer is arranged to output at the output port products of signals applied at the first and second input ports; and
    a first stage including a mixer and a second stage including an amplifier, said stages being arranged in series with each other, so that an output port of the first stage is connected to an input port of the second stage, with the first and second input ports of the sub-harmonic mixer being input ports of the first stage, and the output port of the sub-harmonic mixer being an output port of the second stage, wherein the first stage is arranged to generate a fundamental product and a first third order intermodulation distortion product that are in-phase with each other, and the second stage is arranged to generate a second third order intermodulation distortion product that is in anti-phase to the fundamental product generated by the first stage.

2. The sub-harmonic mixer of claim 1, in which the mixer further comprises a power combiner with two input ports that are arranged to be used as the two input ports of the mixer and with an output port that is connected to the base of a bipolar junction transistor as well as to the cathode of a diode, with the anode of the diode and the emitter of the transistor being grounded, and the collector of the transistor being arranged to be used as the output port of the mixer.

3. A sub-harmonic mixer of claim 2, in which the bipolar junction transistor is replaced by a Field Effect Transistor, with the ports of the bipolar junction transistor being substituted by ports of the Field Effect Transistors as follows:

| Bipolar junction transistor, port | FET, port |
|---|---|
| Collector | Drain |
| Emitter | Source |
| Base | Gate |

4. The sub-harmonic mixer of claim 2, wherein the amplifier includes a bipolar junction transistor, with the base arranged to be used as the input port and the collector being arranged to be used as the output port of the amplifier and of the entire sub-harmonic mixer, with the emitter being arranged to be connected to a DC bias voltage.

5. The sub-harmonic mixer of claim 2, additionally comprising a capacitor between the output port of the first stage and the input port of the second stage.

6. The sub-harmonic mixer of claim 1, in which the amplifier comprises a bipolar junction transistor, with the base arranged to be used as the input port and the collector being arranged to be used as the output port of the amplifier and of the entire sub-harmonic mixer, with the emitter being arranged to be connected to a DC bias voltage.

7. The sub-harmonic mixer of claim 6, additionally comprising a capacitor between the output port of the first stage and the input port of the second stage.

8. The sub-harmonic mixer of claim 1, additionally comprising a capacitor between the output port of the first stage and the input port of the second stage.

9. A sub-harmonic mixer device comprising:
    a first and a second sub-harmonic mixer, wherein each sub-harmonic mixer includes:
        a first and a second input port,
        an output port, wherein the sub-harmonic mixer is arranged to output at the output port products of signals applied at the first and second input ports, and
        a first stage including a mixer and a second stage including an amplifier, said stages being arranged in series with each other, so that an output port of the first stage is connected to an input port of the second stage, with the first and second input ports of the sub-harmonic mixer being input ports of the first stage, and the output port of the sub-harmonic mixer being an output port of the second stage, wherein the first stage is arranged to generate a fundamental product and a first third order intermodulation distortion product that are in-phase with each other, and the second stage is arranged to generate a second third order intermodulation distortion product that is in anti-phase to the fundamental product generated by the first stage;
    a balun, with the balanced ports of the balun being connected to the second input ports of each sub-harmonic mixer, and the unbalanced port of the balun being arranged to be used as an input port of the sub-harmonic mixer device; and
    a differential amplifier with a first and a second input port to which the output ports of the first and second sub-harmonic mixers are connected, respectively, with an output port of the amplifier being arranged to be the output port of the sub-harmonic mixer device.

* * * * *